(12) United States Patent
Dumas (10) Patent No.: US 8,246,201 B2
(45) Date of Patent: Aug. 21, 2012

(54) PRINTED CIRCUIT FOR FIVE LEDS IN SERIES

(76) Inventor: Pierre-Alain Dumas, Paris (FR)

( * ) Notice: Subject to any disclaimer, the term of this patent is extended or adjusted under 35 U.S.C. 154(b) by 976 days.

(21) Appl. No.: 11/813,857

(22) PCT Filed: Jan. 16, 2006

(86) PCT No.: PCT/FR2006/000093
§ 371 (c)(1),
(2), (4) Date: Oct. 19, 2008

(87) PCT Pub. No.: WO2006/075108
PCT Pub. Date: Jul. 20, 2006

(65) Prior Publication Data
US 2011/0103058 A1    May 5, 2011

(30) Foreign Application Priority Data

Jan. 17, 2005 (FR) ..................... 05 00457

(51) Int. Cl.
*F21S 4/00* (2006.01)
(52) U.S. Cl. ............... 362/249.02; 362/249.01
(58) Field of Classification Search ............ 362/249.02, 362/249.01
See application file for complete search history.

(56) References Cited

U.S. PATENT DOCUMENTS

| | | | |
|---|---|---|---|
| 6,404,131 B1 * | 6/2002 | Kawano et al. | 315/82 |
| 2001/0012204 A1 * | 8/2001 | Sharrah et al. | 362/184 |
| 2003/0072153 A1 * | 4/2003 | Matsui et al. | 362/231 |
| 2004/0252501 A1 * | 12/2004 | Moriyama et al. | 362/238 |

FOREIGN PATENT DOCUMENTS

| | | |
|---|---|---|
| DE | 18 69 738 U | 4/1963 |
| DE | 20 2004 002921 U1 | 4/2004 |
| EP | 0 247 377 A | 12/1987 |
| GB | 784 673 A | 10/1957 |

OTHER PUBLICATIONS

International Search Report, Aug. 22, 2006, from International Phase of the instant application.
English Translation of the Written Opinion of the International Search Authority, Jul. 24, 2007, from International Phase of the instant application.
English Translation of International Preliminary Report on Patentability Chapter I, Jul. 24, 2007, from International Phase of the instant application.

* cited by examiner

*Primary Examiner* — Evan Dzierzynski
(74) *Attorney, Agent, or Firm* — Jackson Patent Law Office (57) ABSTRACT

The invention relates to a specific printed circuit (7) comprising independent etched blocks (4) or segments in series of four such that, on a series circuit comprising five LEDs, the four blocks serve as the positioning and connection points for the welding of the pins of the LEDs, said pins being welded in an anode-to-cathode series, or the reverse depending on the direction of the current, i.e. eight electrodes in isolated blocks, such as to ensure that the connection is powered and the LEDs are fixed correctly in series of five. According to the invention, the square or rectangular blocks have a large surface (2) such that the successive holes do not tear the film of epoxy copper. In addition, said blocks are disposed along a path and a successive diagram (21) defines the symbol or pattern to be represented by the LEDs (12) which are disposed and aligned on the other decorated face of the epoxy. The incoming or outgoing bases, which supply the positive (20) or negative (3) power, or the opposite depending on the direction of the LEDs, can comprise the outgoing or incoming base that is common to other series, by means of suitable etching. The negative is always at the center of the pattern. The circuit is divided into three connection zones, A, B, C, and is powered by external contact springs. The invention is intended for the series powering of a longilineal distribution of five LEDs in series, or a multiple thereof.

13 Claims, 5 Drawing Sheets

PRINTED CIRCUIT FOR FIVE LEDS IN SERIES

BACKGROUND OF THE INVENTION

The technical field, or field of the invention, is that of optoelectronics, known as adjustable, all particularly in the area of the structure and the composition of the design of the printed circuits, both the place of connection, and the distribution and powering of the LEDs, these in fact also being with passages crossing that of surface mounted component type.

Historically the circuits for LEDs are etched for 1 to 4 LEDs placed in series, or parallel, thus central sectors varying from 1 to 2, because supplied by a system having limitation of current, transistor type, operational amplifier, micro processor, micro controller exceptionally by voltage regulators in cascade, inoperative because without system of calibration adjustment, therefore without specific etching, even systems attached on the circuit.

Never employed or cited is a system comprising a standard regulator type component having adjustable voltage adjustable on the entire range of brightness of the LED, which would impose de facto a particular distribution, therefore with a specific etching for the connection of the LEDs to be mounted, with design of circuit equally immutable as specific, particularly because they are mounted according to a set rule, and supplied under an adjustable voltage by a voltage regulator, here a LM 317 T.

Thus, this type of etching is not cited up to present, which would have necessitated for such a provision the elaborated and described utilisation of a such component.

SUMMARY OF THE INVENTION

A circuit comprises a substrate acting as an insulator; a first power node having a first polarity; a second power node having a second polarity; a first conductive etched area on the substrate; a second conductive etched area on the substrate; a third conductive etched area on the substrate; and a fourth conductive etched area on the substrate, each of the first, second, third and fourth conductive etched areas being non-contiguous with the other conductive etched areas. The circuit also comprises a first light emitting diode, including an anode connected to the second power node and a cathode connected to the first conductive area; a second light emitting diode, including an anode connected to the first conductive area and a cathode connected to the second conductive area; a third light emitting diode, including an anode connected to the second conductive area and a cathode connected to the third conductive area; a fourth light emitting diode, including an anode connected to the third conductive area and cathode connected to the fourth conductive area; and a fifth light emitting diode, including an anode connected to the fourth conductive area and a cathode connected to the first power node.

DETAILED DESCRIPTION OF PREFERRED EMBODIMENTS

The present invention relates to a printed circuit, the segments or sectors or blocks of which, in a fixed number, are isolated from each other, and arranged in series so that one always has for 6 space receptors (ERI to ER6) four spaces central receptors (ERC 2 to ERC 5) or blocks or sectors, or segments, that are independent from each other.

These spaces receptors have the purpose of assuring connections of 5 LEDs in series, the first connection of the series of 5 starting at the cathode of the first LED in ERI, and the last connection ending at the anode of the last LED in ER6, or the inverse, according to the direction of the current.

The cathodes are of course coupled or connected to the negative or ground, the anodes to the positive, having fixed or continuous variable voltage, classically definied in the profession.

This successful application is only possible with a specific original trace, carried out on the printed circuit, aiming to connect the first anode of the first LED of the series of five on the positive and the last cathode of the last LED on the negative or the inverse, but in a manner to always match a pair of electrodes, cathode anode of two different LEDs on an isolated, closed space to ensure the continuing of the passage of the current from one LED to another from the beginning to the end of the series, without possible short circuit, whether it be with the other series or the general negative and positive supply (ERI and ER6).

Despite difficult, complicated etchings, one attains creation of traces enabling connection in series, always by series of 5, thus with 4 independent blocks, up to 500 LEDs, which is 400 independent blocks, and thus avoid the installation of reconnection strap between tracks for transfer of current and/or resumption of series.

For the series which, because of the pattern to be realized, are not modifiable and of which the number of LEDs involved is not divisible by 5, a series to complete to 5 remains necessary, with at least at minimum a supplementary etching sector block for the complentary LEDs to be arranged, and which on the basis of the system of etching incomplete series, in general from the circuit center, goes in direction from the edge or periphery of this, to complete this series with 5 LEDs.

This assembly in the periphery of the circuit is effectuated so that the ohmic values of the series are always the same in all points on the circuit. The consequence is that, whatever the regulation mode of circuit, the luminosity and brightness remain always the same, constant and equal, in time.

These missing and complementary LEDs are arranged in the edge or periphery of circuit, and are necessarily nonvisible, hidden and soldered flat in surface mounted component fashion, with the electrodes soldered on the specially etched supplementary sectors, thus without any crossing passage. Not operating on the front face, but serving only to ohmically complete the series of five, they are not intended to be visible, and as a result can be tinded, the illumination of the rear face of the circuit being able to be harmful or objectionable.

The LEDs (12) are always connected between themselves in series of 5, the anode of the first coupled to the positive of the circuit. Then its cathode coupled to the anode of the second by the intermediary of a copper-plated block or sector, part of the printed circuit, and in this manner up to the last LED, the whose cathode of which is itself connected directly to negative or the ground.

The connection block most often has the form of a square, rectangle, or a member of having an angle, rhombus, repetition, or another form, but by always having the constraints due the spacing between the leads, on the one hand, is 2.54 mm, and on the other hand, a diameter or body of LED, itself able to vary between 5 and 20 mm.

This has as the consequence of modifying the length and width of central receptor spaces (ERC2 to ERC5), blocks, sectors, segments, consequently the four independent blocks or sites, bases common to the leads of the LEDs, have corresponding size with the plastic body of the LEDs and that they can be aligned without difficulty on the front face of the circuit.

This typography (21) of 5 LEDs, arranged in series and connected to the negative and to the positive at the ends of each series (ERI, ER6), ensures by the intermediary of the 4 isolated, independent central sector blocks (4), ERC2 to ERC5, a variation of total active voltage by series of 5, therefore particularly suitable to the operation of each series.

This total voltage is subdivided by the ohmic value specific to each LED, and which by setting in complete series of the set 5, ensures the subdivision of the necessary minimum voltage for the implementation or operation of the series of 5.

Each LED must thus divide the total minimum and maximum voltage by 5, or represent a ⅕ in order to attribute itself a fraction, in relation to its characteristics.

The arrangement of the LEDs in series of 5, with four independent blocks to ensure the connection of the series of 5, thus enables using a variable calibrated voltage source, that is specially adjustable, here, between 7.5 v and 15 v, to cause illumination of the series of 5.

From this particular setting, is created the series connection of LEDs, by 5 LEDs, with four central independent blocks or sectors, and with connections of the leads of the end LEDs, by their lasts electrodes, with the opposed poles of the supply.

Similarly, the voltages by impulse, component type NE 555, or chopping, or digital type, also require and use this engraving for the use of the LEDs in series of 5, according to a range of evoked voltage, exploitable adjusted and variable with the ohmic value of the LEDs employed.

To avoid differences of voltage drops between diodes and luminosity, this due to the impedance of the semiconductor substrate, one will thus use for the series, LEDs of common color and common characteristics and, therefore, from the same manufacturer.

The assembly of 5 LEDs in series requires 4 central blocks or sites for the connections of the leads of LEDs, blocks that are independent, isolated, and situated at equal distribution on the imaginary axis of the 6 ER, that is 2 before and 2 after, also named and designated ERC2 to ERC5.

These series are mounted in uninterrupted continuous perimetric type row, with a path, an encurelement, following the trace of a pattern to be represented, and comprising only a single opening in this perimeter. This is made possible by the fact that a sector or block is entirely with negative in contact with part C of the circuit, receiving the negative by the contact spring of the control circuit. The passage of the negative pole thus realized, with the placing under voltage powering of the center of the pattern, concretizes in this space, the place of connection, all cathodes of all series, concerning the negative distribution.

This polarity in the center of the pattern, negative or ground, is the provision sought and established, then applied in all the drawings of circuits with assembly of LEDs in series of 5.

The negative is thus input at the center by different sets of engraving, either by passing between two opposed ERCI blocks, or by skirting the blocks or sites, or between two electrodes. The localization of the negative in the central zone of the pattern enables a distribution, a dispersion, and an engraving more precise and more homogeneous.

Consequently, if the ERI receptor space with the negative is in the center of the circuit, it feeds all the series starts commencing by the cathode.

The anodes then being connected towards the other space receptor, ER6, or B put at positive, and situated at the exterior of the circuit and on its external periphery, etching preventing any short circuit, the passage of the utilization current being assured only by the successive fall in the LEDs or electro luminescent diodes plugged in between the interior of the pattern and its exterior, arbitrarily determined by its contour.

The positive is also supplied by a contact spring of the control circuit, but in the part A of the circuit, the transfer of current being ensured between part A and brand part B, by a thermal switch limiting device or dual blade Microtherm brand.

The distribution of the voltage between each common LED of a series of 5 is set, and it enables the variable luminous representation made of a symbol or a pattern, and in the this case would comprise for various esthetic patterns or calculations, at least an incomplete of visible LEDs series, this series could be again completed by at least an etching with at least a supplementary and complementary appendix sector (always of 4) in order to be able to complete the series having 5 LEDs.

This isolated complementary sector(s) is essential, and make it possible to connect at least one complementary LED, to achieve the series of 5, in order not to cause a fault or distortion of brightness with the others visible LEDs, arranged on the front face.

The containment having 4 of the central isolated sectors (ERC2 to ERC5) or independent blocks, for a series of 5 LEDs, with connection of the lasts electrodes of the lasts LEDs on the two different poles of the supply is a definitive provision according to the invention.

In the case of a representation of a pattern having at least two different colors, or where the series would be incomplete for various reasons, supplementary sectors would be etched in order to respect the series of 5 LEDs of each color in order not to cause outage faults of luminosity in the series of colors, of the over brightness or under brightness type, which can appear in cascade.

In this case, supplementary sectors would be etched in proximity to the incomplete zones or sectors for the given color, in order to complete the series of 5 but without using other sectors, that could be vacant for the other colors.

The mounted series of LED can be divisible by 5, for example 40, 50, 150, 200, etc, which is preferable for a simpler distribution and schema, but for non-divisible series by 5, with quantities of 54, 68, 122, 186 LEDs, one needs to complete with 1, 2, 3, 4 sectors, either by a delimitation feature making a sector, for 1, or with total creation 1 sector plus 1 sector straddled, or two sectors plus a straddled sector feature, or 3 sectors plus a straddled feature.

On the straddled feature forming delineation of the last sector, therefore of delineation, is connected the last LED of the series of 5.

Certain representations, to be sufficiently well perceived, require a certain conceptual and memory equilibrium, and require a series non-divisible by 5, very delicate to realize, because of where the last components to be souldered straddled on sectors placed generally at the end of the circuit, to complete the series of 5 LEDs.

Furthermore the series where there would be more than one component or LED to be souldered at the end or periphery is not especially studied, this involving an excess of work, and new provisions in the cradle of assembly and the molding receptor.

Thus in the case of incomplete series, for example 4 LEDs mounted to form a central pattern, the fifth LED is mounted in branch on a special segment sector at the limit or periphery of the circuit, between B and B' and straddled (18) to obtain the completed series having 5 LEDs.

This circuit has minimum etching, that is to say that only are eliminated with acid by photo etching, stet copper sections enables an outlining of the blocks and spaces having to ensure the connection of the LEDs in series, the isolation of the series with respect to each other, and the transport and the connection of the current. This type of etching is known by the name of copperplate etching, which is realized by milling.

In such a context and considering the relatively substantial intensity of the current of 0.25 A to 5 Amperes and more according to the size of the symbol to be represented, and under a service voltage which can go up to 13 volts, to the limit of constant output U/I, the tinning of the circuit becomes essential to ensure the security of distribution, because the original copper-plated face with a thickness of 47 microns, is developed insufficiently to secure such a transport.

The segments or blocks or sectors of the circuit according to the invention being extremely numerous, require a thorough verification of the separations between each block, which are delimited by channels with partial or total separations.

Each power pack or site, or zone spaces receptors of polarity, is obtained by separations realized by attack with chloride, on the copper, in the thread-like form of channels of 0.8 mm width, this for trimming and delineating these blocks or spaces, these having to ensure all three of connections, insulations, and current inputs.

The verification of the state of the traced channels separating the studs or segments, is necessary considering the operating conditions, in particular the successive falls or growth of voltage in the blocks, between 7.5 V to 12.5 V, under 30 to 100 mA by series, and the absence of short circuit between them, and with positive negative spaces receptors B and C.

The circuit according to the invention, known as 5-based printed circuit, or 5-based printed daughter circuit, does not include its own active or passive regulation member, and its use is only made possible by the utilization of a second circuit, known as control circuit or mother circuit, and to it only is provided with all the functions of regulation and of connections.

The printed daughter circuit based on 5 LEDs or application circuit, according to the invention, is provided for use in pairs, with another special connection and control circuit, having independent and external regulation, with the result that this based-5 circuit, is not equipped with any active or passive regulation member. It is thus dependent or slave type. Broad etchings of the sectors on the chart, 8 mm, have as an aim of protecting the copper pierced site from any wrenching and intended for the welding of the electrodes, the quantity of piercing to be performed being sufficiently substantial so that this problem occurs, which in the area of manufacture poses enormous problem of reliability and of result.

Its operation is dependent from the mother circuit arranged as in the patent application No 05 00002, and the circuit according to the invention is different from the previous application, N° 04 13549, for the following reasons:
  its control mode is external,
  its supply mode is external
  absence of wiring, springs, thimbles
  absence of any active or passive regulation element
  dependent from a second circuit for its implementation
  the polarities are localized around and in the center of the pattern
  connections of the ER series are effected by openings alternatively on the negative, then on positive at the end of each series
  the negative polarity is placed in the center of the pattern
  the input of the negative is effected on an ER negative site common to two series placed head to foot
  the path of the series LEDs is continuous, serial, perimetric, concentric
  series upstrokes and downstrokes of 10 LEDs, effected on the positive and negative
  the delineation of general zones or sectors installing a cut circuit,
  cut circuit placed just over the thermal mounted of the LEDs in the vertical axis, and souldered on the circuit to collect the radiations of the conducting leads of the LEDs as well as of the epoxy
  the series of LEDs are completed with 5 if necessary if a pattern restrains them
  the pattern is placed in the center of the circuit
  does not comprise any other boring except that of the visible LEDs in front
  if the negative ERI output point can comprise two series outputs with cathode, the input point, ER6 cannot never comprise both common anodes of both common series
  circuit with series of 5 LEDs, not arranged in pure parallel, but in Indian file, according to contours of the pattern
  circuit with generalized copperplate etching
  does not comprise any attachment hole of the circuit
  does not comprise any dissapator plate
  the circuits have very large dimensions
  the circuits are intended to be in the groove of a frame, by the rear The circuit, the negative in the center of the pattern, the positive around the pattern, with general delimited sectors A5B5C, to ensure the installation and operation of a thermo mechanical anti thermal runaway breaker circuit, neutral component.

The printed circuit is realised by the organization of power packs or common bases in series of 4 blocks, in a manner to connect 5 LEDs in ordered series, anode cathode on base or common block, or the inverse, in a manner to input to the first anode of the series of 5 on the positive of the supply circuit, the last electrode of the series, called cathode, connected with negative of the circuit or ground.

There are only thus 2 contacts for the supply of a series of 5 LEDs, the first to the first lead of the first LED, the last to the last lead of the last led, these being diodes, therefore with the direction of unidirectional current, one will take care that the orientations of the LEDs are all in the same direction, to which end one will turn the LEDs a half turn so that the current can pass in the 5 LEDs, according to the presently well-known technique.

The printed circuit (7) according to the invention, 5-based, is also called daughter circuit, or application circuit, in relation to its connection mode, having dependence on another circuit, known as mother or command, that ensures its electric viability.

This mode of connection according to the invention is completely passive, and it is realized by springs or piano rod chord, forming contacts and supported on the daughter circuit in the center of the special zones (A) and (C) (11) external to the pattern, and provided for this purpose.

Consequently, the daughter circuit according to the invention does not carry any trace of connection souldering, nor even in the form of jack be plugged in.

The daughter circuit is also known as passive, because it does not comprise any regulation member, but only operative resistive LEDs (12) passages crossing the epoxy surface (16) covered with baize (13). A circuit protection thermal switch (17) is souldered straddled between the part A (8) and the part B (9), in the high part and at the limit in periphery of the circuit.

The thermal mechanical blade switch cuts the contact to a pole of the general supply, by deformation of its blade at approximately 65 to 85° degrees centigrade, and thus protects the circuit, the framework, and all its accessories from an uncontrolled elevation of the interior or exterior temperature, which can lead to damage or an accidental destruction or an ignition of the assembly under certain extreme conditions.

The circuit according to the invention includes networks of squares or rectangles (19) that have variable numbers but never less than four for an assembly series of 5 LEDs, except the case B', (10) and that are isolated places and sites for the connection and souldering (15) of the leads (14) or electrodes of LEDs by 2, souldering anode then cathode, or the inverse.

Even in the case of offset of the 5th LED to the bottom of the circuit to preserve the complete series of 5, we have the four sites.

In the case of a straight series of 10 LEDs, or 2 series of 5 LEDs, one has for example the first lead anode connected positive, then on each contact stud, in order, the cathode lead of the first LED, then the anode lead of the second LED soldered on the same contact stud or site, and so on, the last lead of the fifth LED being the cathode soldered in the negative zone, which can be the restart block or place isolated from the 2nd series of 5, whether it be this block, then closed and common base, or then the original start block open for the second series. In all the cases, there is always a series of 5 LEDs between the negative and the positive of the supply of the circuit, and according to the invention it cannot be otherwise from that.

There are 6 ER space receptors of the electrodes of the 5 LEDs series

| ER1 | ER2 | ER3 | ER4 | ER5 | ER6 |
| --- | --- | --- | --- | --- | --- |

There are 4 isolated ERC central respector spaces or blocks

| ERC1 | ERC2 | ERC3 | ERC4 |
| --- | --- | --- | --- |

The LEDs are set and mounted soldered in series of 5. They are mounted head to foot, that is to say anode/cathode, a/c, we have:

| a/c, 1 | a/c, 2 | 3 | a/c, 4 | 5 | a/c, 6 | 7 | a/c, 8 | 9 | 10 |
| --- | --- | --- | --- | --- | --- | --- | --- | --- | --- |
| AP | | BI | | BI | | BI | | BI | DN | part 1 soldered on the positive input block AP
parts 2, 3 soldered on the first isolated block BI
parts 4, 5 soldered on the second isolated block BI
parts 6, 7 soldered on the third isolated block BI
parts 8, 9 soldered on the fourth isolated block BI
part 10 soldered on the negative output block DN There are thus the 4 distinct isolated blocks or sites to which are connected 8 electrodes of the LEDs series of a series of 5. According to the invention, the series can be in a divisible number by 5, or nondivisible by 5, with a number of LEDs to be completed to obtain a series of 5.

The circuit is divided by features of separation (1) in three large vertical zones, A, B, C, for the divisible series of 5, and it is divided with an additional zone called B', (10) for the series of 5, nondivisible by 5, with a number of LEDs to be completed the circuit according to the invention is intended to be placed in a frame, maintained in the groove of the frame, by screw or plates, fasteners, pegs, and reentered by the rear face of the aforesaid frame, be it metallic, wood or plastic (composite).

In the case where the printed daughter circuit is divided in four parts, it is decomposed into Part A connected to positive, transmits the positive to the
Part B by thermal switch, soldered straddled, in the upper boundary of the pattern, moulding area
Part B' where a LED is soldered straddled between B and B', the anode from this 5th LED being soldered in B and cathode in B', to re-establish a complete series of 5 LEDs.
Part D connected to the negative, feeds center negative pattern by a contact channel, replacable by a strap, or an isolated flying jumper wire The negative or ground is in the center (3) of the pattern (2), and it is common to the connection surface of the part C with the aid of a channel created for this inter-relation with the range of connection of the spring on the part C (6). The current inputs are situated in 2 exterior limit zones, A and C, or are respectively connected by spring pressure the positive and the negative. The positive input to zone A is transferred to the zone B by a thermal security switch. Associated with it can be another thermal fuse having definitive interruption by fusion.

Zone B feeds in positive voltage to all the exterior contour (20) of the pattern, and at each time that a start of series occurs, anode with positive, by an open block, one rather often newly finds open 10 LEDs further for a new series of 10 LEDs, except with the accesses of the input zone of the negative to the linterior of the pattern.

An opening for anodic connection in zone B in fact enables connecting to the positive, 10 LEDs in the direction going up and 10 LEDs in the direction going down of the circuit, or its perimeter, except at the accesses of the transfer zone from negative to the center of the pattern, or the series are simple and limited to 5 LEDs. There is thus on all the external circumference of the circuit, a mixing of assembly between the assembly in groove or case, with 2 series of 5 LEDs in each direction, on certain portions, and an assembly in final block, with only 1 series of 5 LEDs on each side at the area of the passage from negative of the zone C towards the center of the pattern.

An opening for cathodic connection in central zone makes it possible to connect the 10 LEDs to negative in the direction going up and 10 LEDs in the direction going down of the circuit, or its perimeter, except with the accesses of the transfer zone from negative, or the series are simple and limited to 5 LEDs. There is on the internal circumference of the circuit, a mixing between assembly in case and final block, with 1 series of LEDs on each side of the negative input in the center of the pattern.

Connections of the LEDs are made straddled and in series between the positive sector B and the center of the circuit (3) to negative, always by series of 5 LEDs, and which can be aggregated by 10 from one side, because on the other side, at the 5th block or site, the opposite polarity is implemented. The zones of connection of the springs are preferably placed under the arms of the crosses, or on each side of the patterns, in zones of large surface, and not comprising any component. The features of delineation of the zones A, B, C follow the pattern over all its length at approximately 1 cm from this, while leaving and while arriving on the 2 small sides of the rectangle at the format of the circuit.

Figure 1:
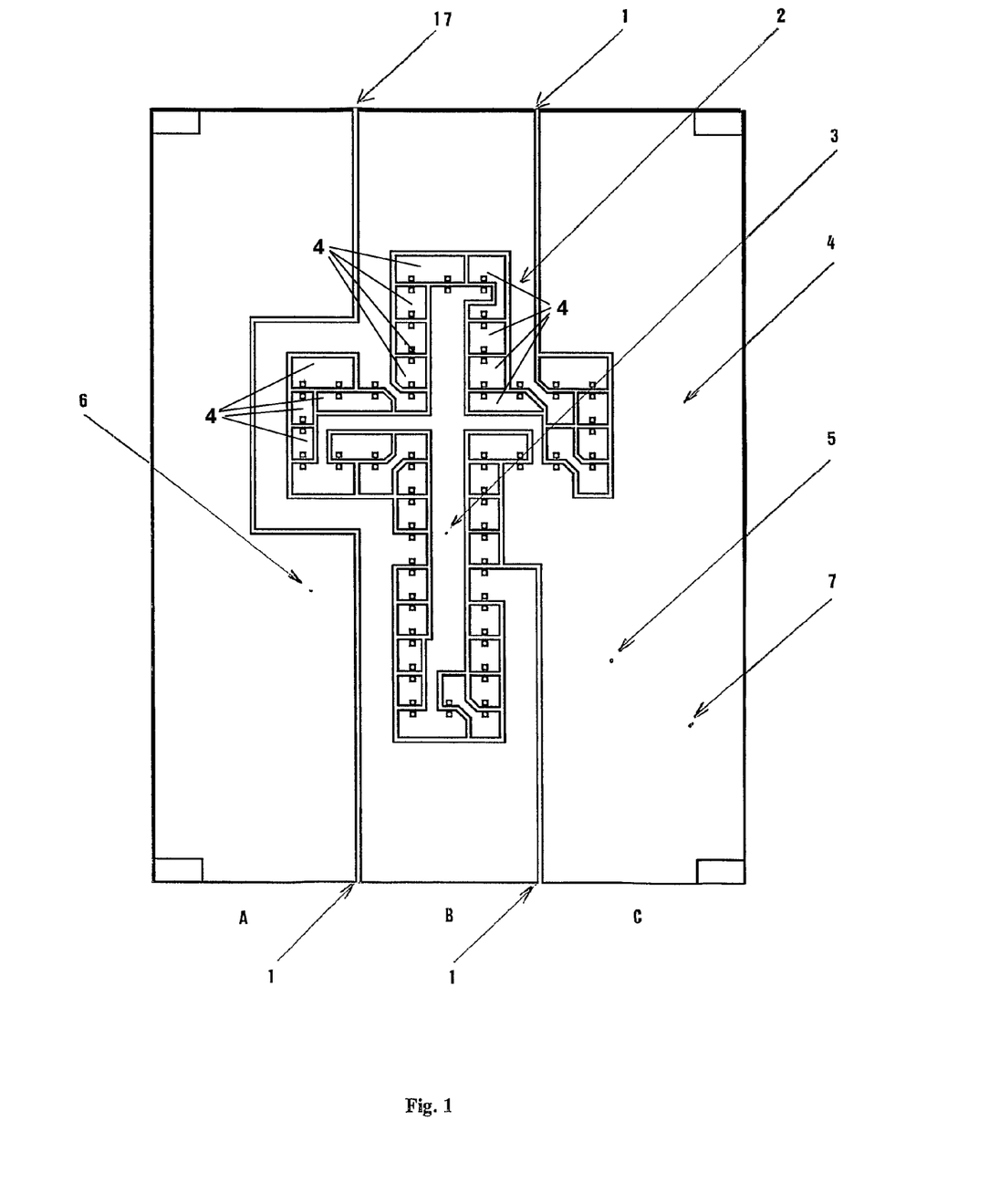
FIG. 1 is a plan view of an embodiment.

FIG. 1 represents a Latin cross on a printed circuit, the white features representing only the etched parts thus removed, taken out by the acid, the black parts or coppers remaining on the epoxy plate and forming the finished circuit, properly speaking.

The attack is thus minor, and according to the outlined topography or schema it largely favours the circuit by leaving it refuge zones, or blocks or site for the soldering and the connection of the leads of the LEDs, as well as its plating and its reliability.

In the low part, largest of the cross or pattern, in zones A and C will come to touch by contact the current input and return springs of the mother circuit. This LED Latin cross diameter 5, 5-based, having a distribution of 4 LEDs on the top from the left arm, 3 LEDs on the top of the head, and 4 LEDs on the top of the arm must, consequently 4.3.4, color of LEDs not indicated, to be specified later, the total of the LEDs is 40 in this case, that is to say 8 series of 5 LEDs series, with the negative in the center of the pattern.

Figure 2:
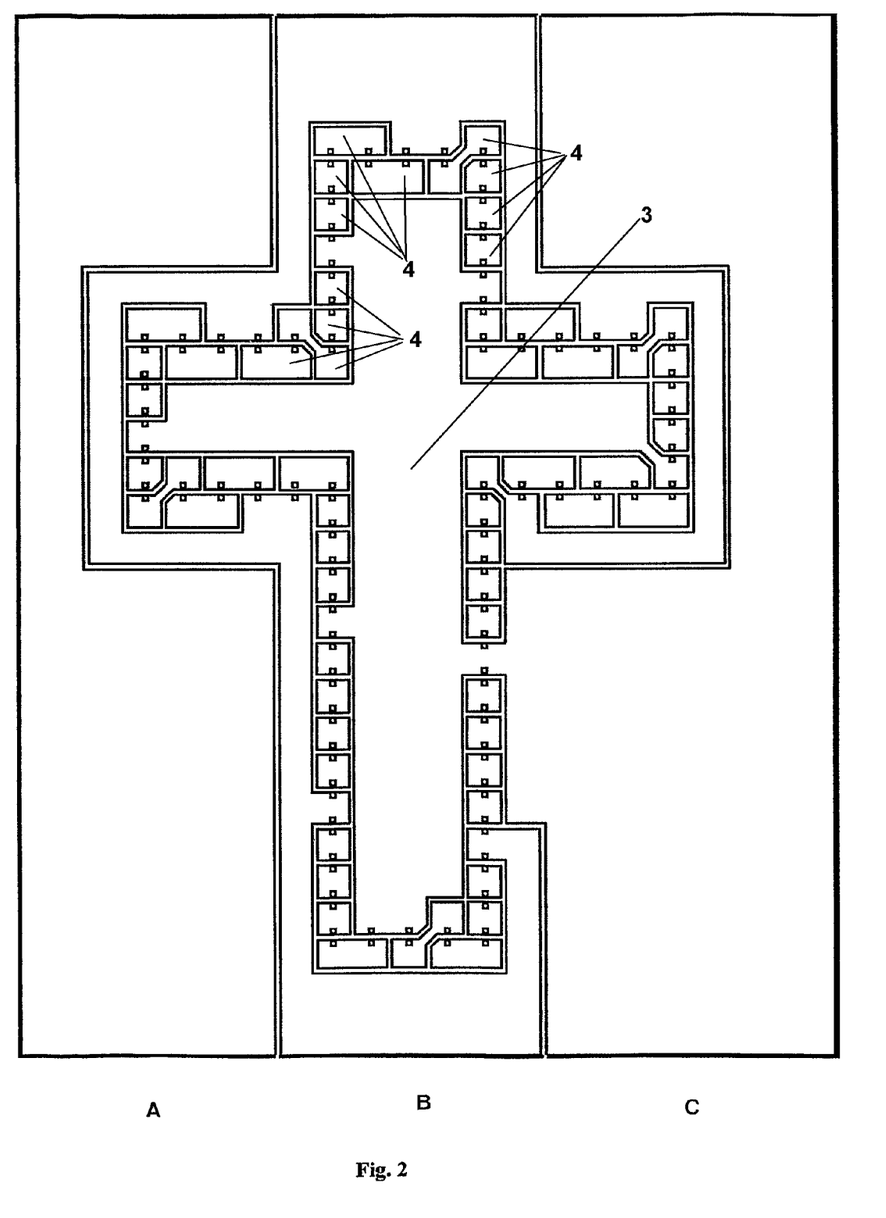
FIG. 2 is a plan view of another embodiment.

FIG. 2 represents another much larger Latin cross, 70 LEDs, be it 14 series of 5 LEDs series, diameter 5 mm, standard distribution 6.5.6, with center pattern coupled to the negative. Connections on great free surfaces A and C of the low part of the cross, possibility being in the high part, under the thermal interruptor.

Figure 3:
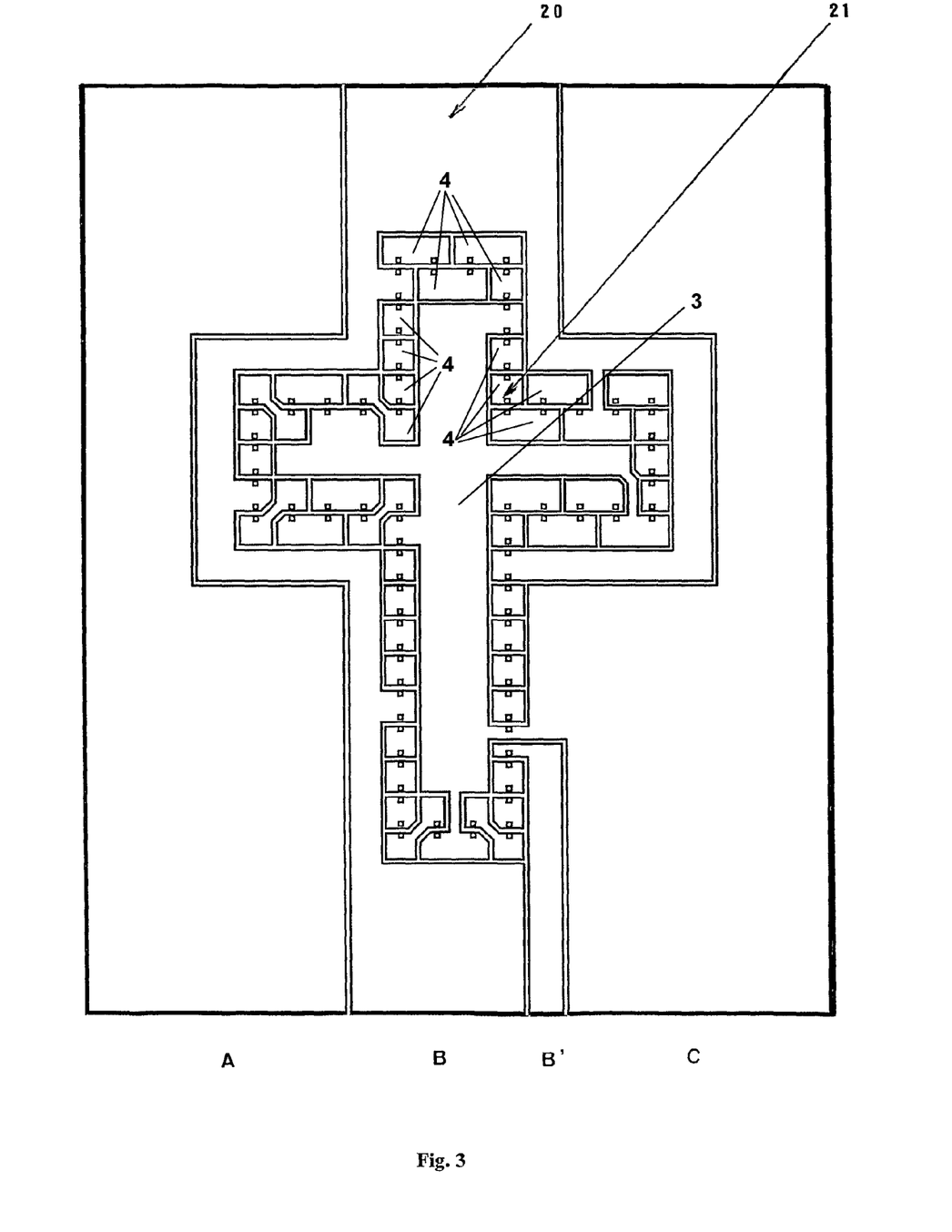
FIG. 3 is a plan view of yet another embodiment.

FIG. 3 represents another Latin cross, with 54 visible LEDs plus a LED soldered straddled between B and B' to make the 55th, the 5th of the series of 5, that is to say 11 series of 5. This LED will be soldered suitably straddled, then will be painted black in a manner not to cause parasitic interference with the luminous face of the framework.

The current connections will be those defined above.

Figure 4:
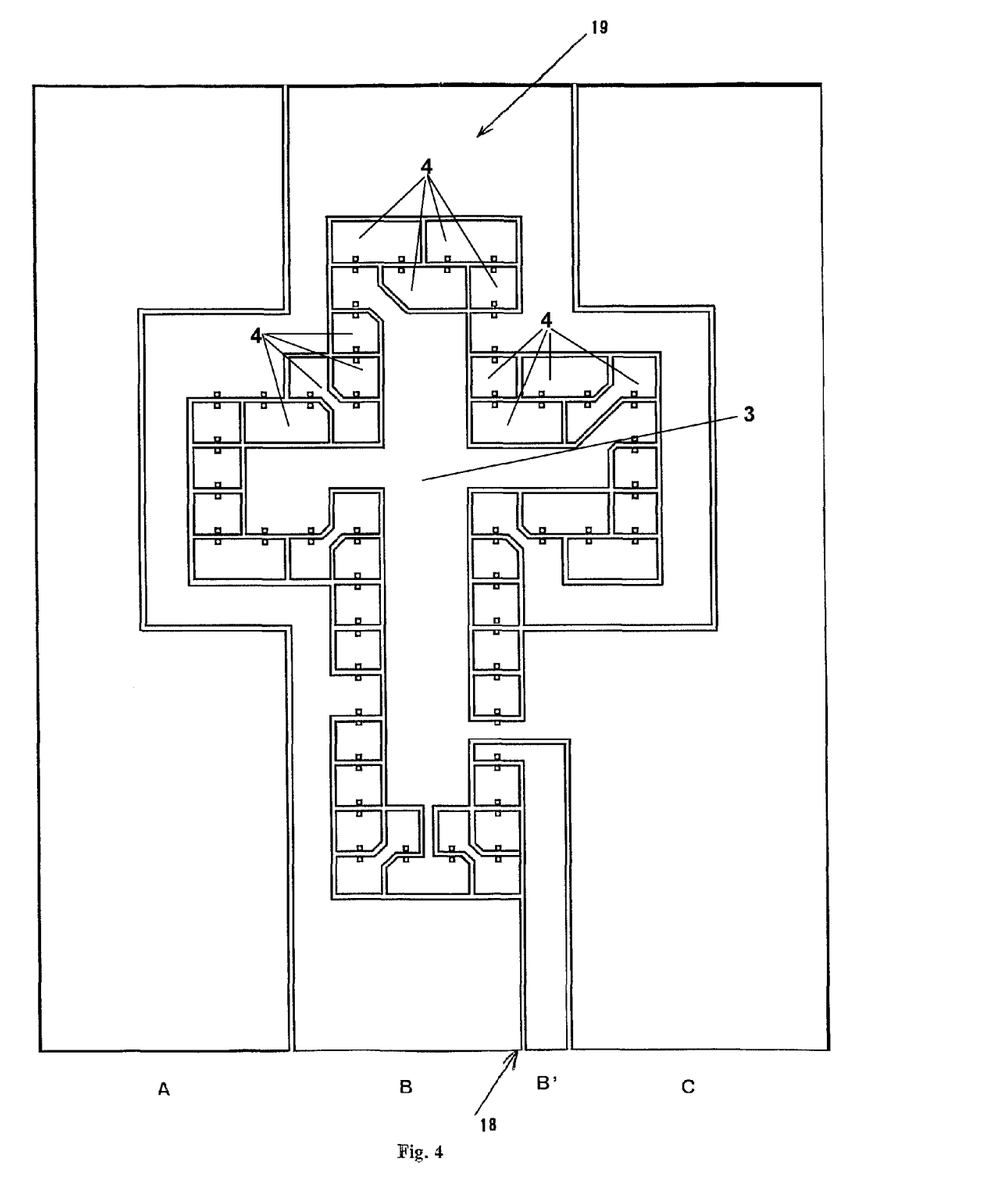
FIG. 4 is a plan view of yet another embodiment.

FIG. 4 represents another type of Latin cross, having LED of diameter 8 mm, base 5 or series of 5 LEDs, or one has 44 LEDs, as a result of it missing one that of will be soldered straddled between B and B', anode soldered oriented positive, which will make the 5th from the series of 4, consequently a complete series of 5 LEDs and for a total number of 9 series of 5, that is to say 45 LEDs. The connection zones are traditional, namely A and C, as mentioned above.

To each type of pattern, that it is a star, a signal, a flag, a cross, of any type, Latin, papal, orthodoxe, Celtic, Anglican, etc, are mounted several series associating 5 LEDs with multiples, according to the development, and thus the size of the representation to be symbolized is unlimited.

Consequently, the number of LEDs varies considerably with each new creation. This is in fact a new phototool that must be realized, with always the same rule of 5 LEDs in series and multiples of 5 if possible, all the other components of regulation to be adjusted in particular according to the new electric configuration of the realisation.

Figures And Sketch

| DESIGNATION | Numbering | Sketch |
| --- | --- | --- |
| Separation markers | 1 | 1, 2, 3, 4 |
| Design pattern | 2 | 1, 2, 3, 4 |
| Negative circuit center | 3 | 1, 2, 3, 4 |
| Connection blocks | 4 | 1, 2, 3, 4 |
| Negative connection surface zone | 5 | 1, 2, 3, 4 |
| Positive connection surface zone | 6 | 1, 2, 3, 4 |
| Copper printed circuit | 7 | 1, 2, 3, 4, 5 |
| Part A | 8 | 1, 2, 3, 4 |
| Part B | 9 | 1, 2, 3, 4 |

-continued

Figure 5:
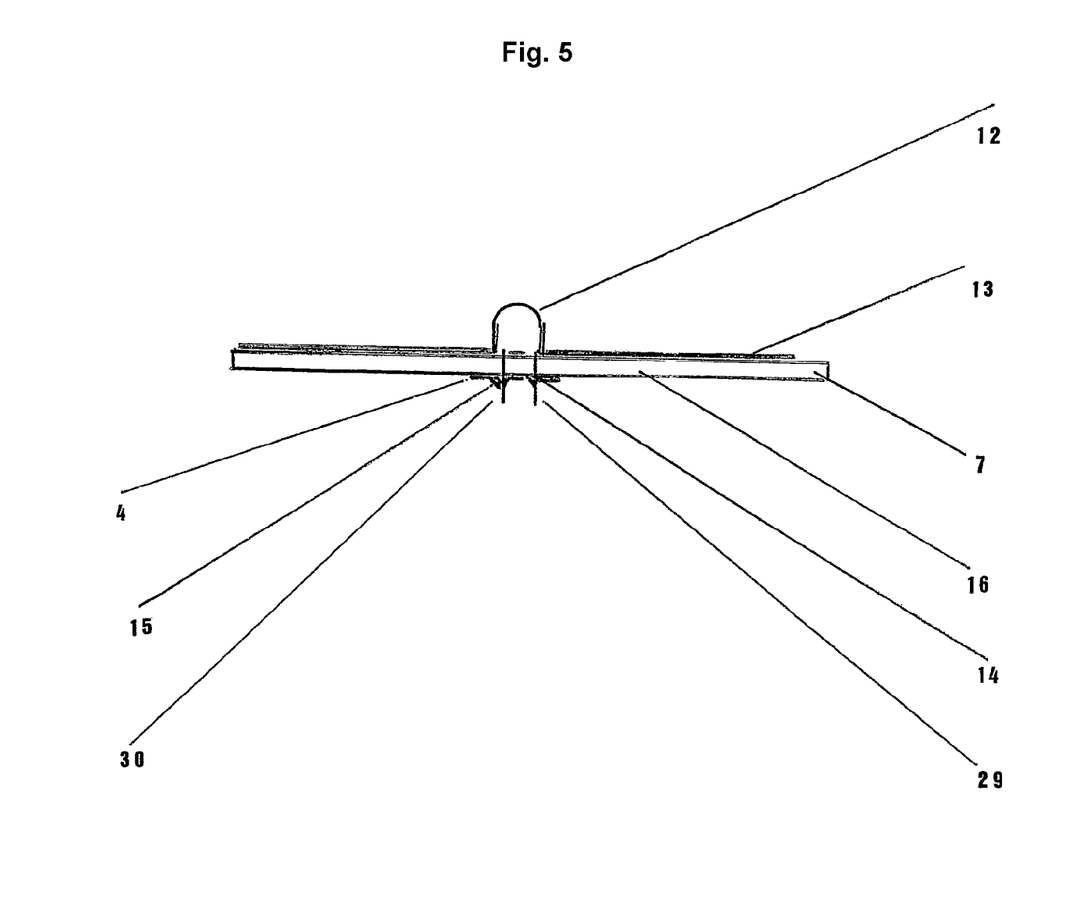
FIG. 5 is a section view.

| DESIGNATION | Numbering | Sketch |
| --- | --- | --- |
| Part B' | 10 | 3, 4 |
| Part C | 11 | 1, 2, 3, 4 |
| LEDs | 12 | 5 |
| Baize | 13 | 5 |
| LED leads | 14 | 5 |
| LED solder | 15 | 5 |
| Epoxy | 16 | 5 |
| Microtherm upper limit switch | 17 | 1 |
| LED soldered straddled between B and B' | 18 | 4 |
| Large blocks for 8 and 10 mm diameter LEDs | 19 | 4 |
| Exterior of the positive pattern | 20 | 3 |
| Circuit typography | 21 | 3 |
| Continuous concentric perimeter | 22 | 3 |
| Interior of the negative pattern | 23 | 3 |
| Separation channels | 24 | 1 |
| Negative current input passage | 25 | |
| Positive current input passage | 26 | |
| ER1 receptor space | 27 | |
| ER6 receptor space | 28 | |
| LED cathode | 29 | 5 |
| LED anode | 30 | 5 |
| FIG. 1 | | CL5 B5 434 |
| FIG. 2 | | CL5 B5 656 |
| FIG. 3 | | CL5 B5 545 |
| FIG. 4 | | CL8 B5 444 |
| FIG. 5 | | SECTION |

The invention claimed is:

1. A circuit comprising:
a substrate acting as an insulator;
a first power node having a first polarity;
a second power node having a second polarity;
a first conductive etched area on the substrate;
a second conductive etched area on the substrate;
a third conductive etched area on the substrate;
a fourth conductive etched area on the substrate, each of the first, second, third and fourth conductive etched areas being non-contiguous with the other conductive etched areas;
a first light emitting diode, including an anode connected to the second power node and a cathode connected to the first conductive area;
a second light emitting diode, including an anode connected to the first conductive area and a cathode connected to the second conductive area;
a third light emitting diode, including an anode connected to the second conductive area and a cathode connected to the third conductive area;
a fourth light emitting diode, including an anode connected to the third conductive area and cathode connected to the fourth conductive area; and
a fifth light emitting diode, including an anode connected to the fourth conductive area and a cathode connected to the first power node,
wherein the first power node includes an exterior boundary zone C and the second power node includes an exterior boundary zone A, and the exterior boundary zone A comprises a connection to the second polarity by a contact spring, and the second polarity A is transferred from the exterior boundary zone A towards a central zone B by a mechanical security thermal switch.

2. A circuit comprising:
a substrate acting as an insulator;
a first power node having a first polarity;
a second power node having a second polarity;
a first conductive etched area on the substrate;
a second conductive etched area on the substrate;

a third conductive etched area on the substrate;
a fourth conductive etched area on the substrate, each of the first, second, third and fourth conductive etched areas being non-contiguous with the other conductive etched areas;
a first light emitting diode, including an anode connected to the second power node and a cathode connected to the first conductive area;
a second light emitting diode, including an anode connected to the first conductive area and a cathode connected to the second conductive area;
a third light emitting diode, including an anode connected to the second conductive area and a cathode connected to the third conductive area;
a fourth light emitting diode, including an anode connected to the third conductive area and cathode connected to the fourth conductive area; and
a fifth light emitting diode, including an anode connected to the fourth conductive area and a cathode connected to the first power node,
further including
a plurality of subcircuits, including a first subcircuit, a second subcircuit, and a third subcircuit, each subcircuit comprising a respective:
first conductive etched area on the substrate;
second conductive etched area on the substrate;
third conductive etched area on the substrate;
fourth conductive etched area on the substrate, each of the first, second, third and fourth conductive etched areas being non-contiguous with the other conductive etched areas;
first light emitting diode, including an anode connected to the second power node and a cathode connected to the first conductive area;
second light emitting diode, including an anode connected to the first conductive area and a cathode connected to the second conductive area;
third light emitting diode, including an anode connected to the second conductive area and a cathode connected to the third conductive area;
fourth light emitting diode, including an anode connected to the third conductive area and cathode connected to the fourth conductive area; and
fifth light emitting diode, including an anode connected to the fourth conductive area and a cathode connected to the first power node.

3. A circuit in accordance with claim 2 wherein the light emitting diodes traverse the substrate, and the substrate is covered with baize, textile or painting.

4. A circuit in accordance with claim 2 wherein the first power node includes an exterior boundary zone C and the second power node includes an exterior boundary zone A.

5. A circuit in accordance with claim 4 wherein the exterior boundary zone A comprises a connection to the second polarity by a contact spring.

6. A circuit in accordance with claim 4 wherein the first polarity is supplied by a second contact spring on the exterior boundary zone C.

7. A circuit in accordance with claim 2 wherein a light emitting diode in one of the plurality of subcircuits is masked.

8. A circuit in accordance with claim 2 wherein the plurality of subcircuits, includes a first subcircuit, a second subcircuit, and a third subcircuit,
wherein the power voltage node includes a first power conductive etched area on the substrate, and the second power voltage node includes a second power conductive etched area on the substrate,
wherein the first power etched area includes a first connection site and a second connection site, the second power etched area includes a first connection site, a second connection site, a third connection site, and a fourth connection site, each of the first connection site, a second connection site, a third connection site, and a fourth connection site of the second power area being collinear with a line defined by the first connection site and second connection site of the first power area.

9. A circuit in accordance with claim 2 wherein each connection site defines a hole.

10. A circuit in accordance with claim 2 wherein the conductive areas includes copper.

11. A circuit in accordance with claim 2 wherein the substrate defines a first major surface and a second major surface, each light emitting diode includes a body on the first major surface, and the conductive areas are on the second major surface.

12. A circuit in accordance with claim 2 wherein each light emitting diode includes leads traversing the substrate.

13. A circuit in accordance with claim 2 wherein the substrate includes epoxy.

* * * * *